US010635760B2

(12) United States Patent
Chok et al.

(10) Patent No.: US 10,635,760 B2
(45) Date of Patent: Apr. 28, 2020

(54) REAL-TIME FLUID CONTAMINATION PREDICTION USING BILINEAR PROGRAMMING

(71) Applicant: Weatherford Technology Holdings, LLC, Houston, TX (US)

(72) Inventors: Hamed Chok, Houston, TX (US); Endre Anderssen, Houston, TX (US); Jess V. Ford, Houston, TX (US)

(73) Assignee: Weatherford Technology Holdings, LLC, Houston, TX (US)

( * ) Notice: Subject to any disclaimer, the term of this patent is extended or adjusted under 35 U.S.C. 154(b) by 1021 days.

(21) Appl. No.: 15/075,791

(22) Filed: Mar. 21, 2016

(65) Prior Publication Data

US 2017/0270227 A1  Sep. 21, 2017

(51) Int. Cl.
*G06F 17/10* (2006.01)
*G06F 17/50* (2006.01)
*E21B 49/10* (2006.01)
*G06F 17/11* (2006.01)

(52) U.S. Cl.
CPC .......... *G06F 17/5009* (2013.01); *E21B 49/10* (2013.01); *G06F 17/11* (2013.01)

(58) Field of Classification Search
CPC ....... E21B 49/00; G06F 17/11; G06F 17/5009
USPC .................................. 703/2, 9, 10
See application file for complete search history.

(56) References Cited

U.S. PATENT DOCUMENTS

| 6,343,507 | B1 | 2/2002 | Felling et al. |
| 6,350,986 | B1 | 2/2002 | Mullins et al. |
| 7,251,565 | B2 * | 7/2007 | Storm, Jr. ............ G01N 9/36 |
| | | | 702/6 |
| 7,372,264 | B2 | 5/2008 | Akkurt et al. |
| 8,274,865 | B2 | 9/2012 | Kajiwara |
| 8,352,205 | B2 | 1/2013 | Myrick et al. |
| 2013/0233538 | A1 * | 9/2013 | Chatterji ............. E21B 47/00 |
| | | | 166/250.12 |
| 2014/0278113 | A1 | 9/2014 | Chok et al. |
| 2016/0032718 | A1 * | 2/2016 | Jones ................... E21B 49/005 |
| | | | 73/152.28 |
| 2016/0334531 | A1 | 11/2016 | Elkington |
| 2017/0122923 | A1 | 5/2017 | Chok |

OTHER PUBLICATIONS

Search Report in counterpart UK Application No. GB1704439.7 dated Sep. 1, 2017, 5 Pages.
Proett, M. et al., "Formation Testing Goes Back to the Future," SPWLA 51st Annual Logging Symposium, Jun. 19-23, 2010, 10-pgs.

* cited by examiner

*Primary Examiner* — Andre Pierre Louis
(74) *Attorney, Agent, or Firm* — Blank Rome, LLP (57) ABSTRACT

Methods and systems are described for estimating the level of contamination of downhole fluid and underlying composition using physical property measurements, and mathematical modeling of contamination functions and fluid property mixing laws. The proposed approaches enable computation of estimates of the pumping time needed to achieve a certain contamination threshold level and the determination of whether or not sampling is appropriate at the current point in time based on the predicted compositional properties of the formation fluid.

50 Claims, 3 Drawing Sheets

REAL-TIME FLUID CONTAMINATION PREDICTION USING BILINEAR PROGRAMMING

TECHNICAL FIELD

The present invention relates to the field of characterization of fluid compositions in wellbores, and in particular to a technique for real-time prediction of fluid contamination using bilinear programming.

BACKGROUND ART

Formation fluid obtained from a reservoir generally contains a number of natural constituents, such as water, super critical gas, and liquid hydrocarbons. In addition to these natural constituents, the composition of the formation fluid may also include an artificial contaminant such as filtrate including water-based mud or oil-based mud, used during drilling operations.

Constituents of this formation fluid may be identified by sampling the fluid and then conducting an analysis on the composition of the sampled fluid. The analysis is generally performed by making special measurements of the fluid to characterize the composition and as such infer many properties of interest about the fluid. Knowledge of these properties is useful in characterizing the reservoir and in making many engineering and business decisions.

Various tools can be used to perform analysis of downhole fluids. For example, spectrophotometers, spectrometers, spectrofluorometers, refractive index analyzers, and similar devices can be used to analyze downhole fluids by utilizing appropriate sensors to measure the fluid's spectral response. Another type of measurement that can be made on sampled fluid is taking density measurements. For example, density measurements are sometimes made at fixed time intervals, and analyzed to estimate the sample's quality. The repeated density measurements can be used to plot the change in density over time.

Characteristics of this density-time plot can then be used to assess the composition and contamination level of the sampled fluid. Other types of measurements that can be used in characterizing fluid composition include monitoring density, pressure, temperature and the like.

Though various techniques have been used in the past for characterizing fluid composition of a fluid sample, most of these techniques lack the level of accuracy desired and may also be inefficient. For example, a sample that is taken with too high a contaminant level may produce inaccurate or misleading results about the composition of the formation fluid. Historically, the problem is either handled by assuming that the exact properties of the filtrate and the formation are known, in addition to the initial condition, or by simply watching the changing measurement of the mixture and waiting for a measurement plateau that is interpreted as indicative of maximum achievable fluid purity.

BRIEF DESCRIPTION OF DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

DESCRIPTION OF EMBODIMENTS

In the following description, for purposes of explanation, numerous specific details are set forth in order to provide a thorough understanding of the invention. It will be apparent, however, to one skilled in the art that the invention may be practiced without these specific details. In other instances, structure and devices are shown in block diagram form in order to avoid obscuring the invention. References to numbers without subscripts or suffixes are understood to reference all instance of subscripts and suffixes corresponding to the referenced number. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one embodiment of the invention, and multiple references to "one embodiment" or "an embodiment" should not be understood as necessarily all referring to the same embodiment.

As used herein, the term "a computer system" can refer to a single computer or a plurality of computers working together to perform the function described as being performed on or by a computer system.

As described in more detail below, various embodiments allow predicting the percent (or fraction of) fluid contamination in real-time i.e., the volume of the mud filtrate invading the formation fluid inside the pump-out tool relative to the total fluid volume. Although described below in terms of spectroscopic measurements, any other measurable fluid properties that satisfy a linear mixture can be used, including density and refractive index. The techniques described below do not assume that the formation or the filtrate properties are directly measurable. Instead, the assumption is that only the property of the mixture can be measured. Thus these techniques are applicable in the most severe of all cases, and are often also the most practical as the filtrate used is rarely exactly known. The techniques described below do not make any assumptions about any particular initial condition, such as a known initial filtrate fraction at the first time tick.

The techniques described below employ a bilinear programming framework to predict bounds on the fraction of the contaminated fluid in real-time. The description is written in terms of spectroscopic measurements, but the techniques can be used anywhere where the measured mixture property is linear in terms of those of the mixture components, which may themselves be unknown but can be constrained within linear spaces. Bilinearity comes into play by virtue of the fact that we are solving a linear mixture system of components where the components themselves live in linear spaces.

Figure 1:
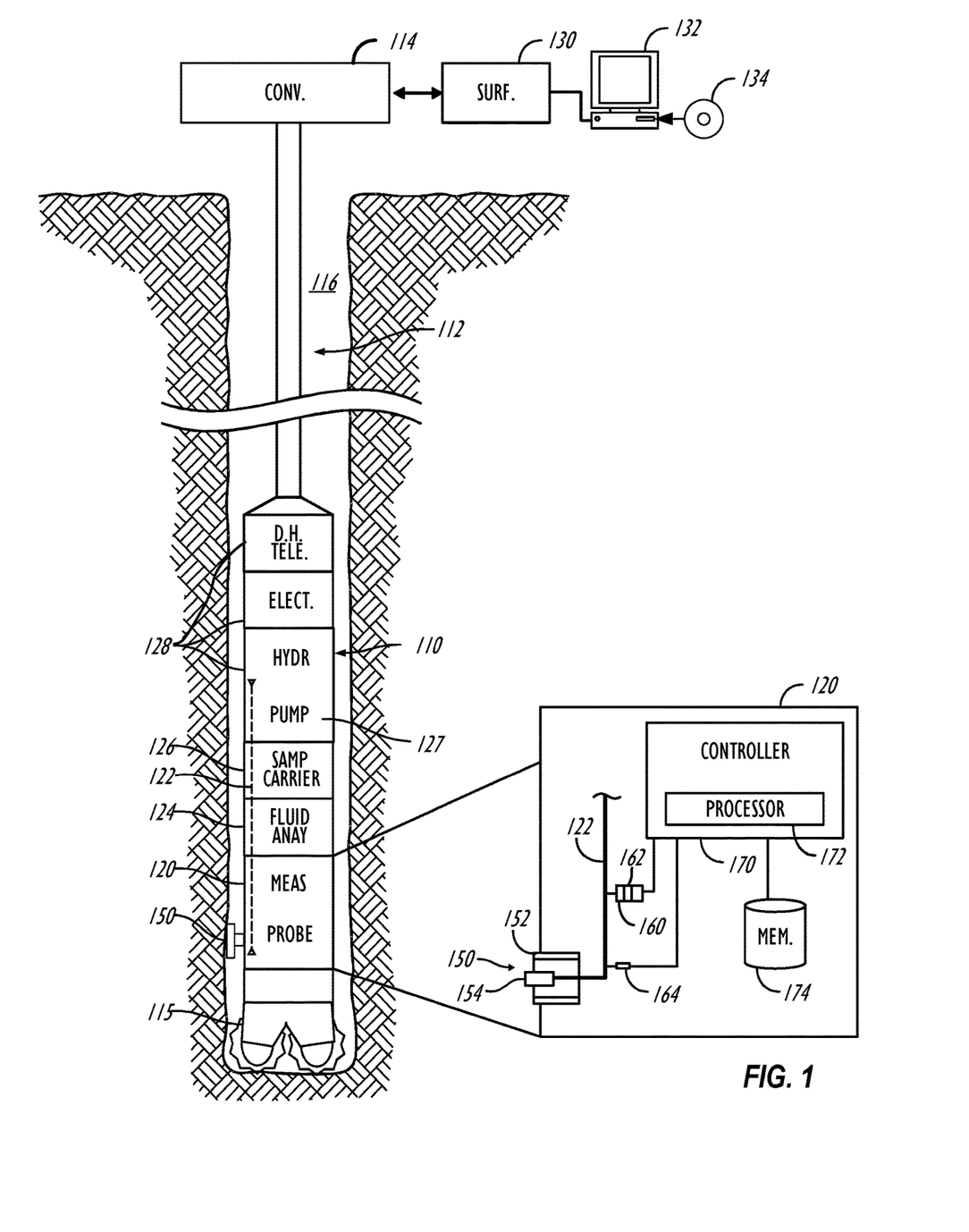
FIG. 1 is a schematic diagram illustrating application of real-time fluid contamination prediction using bilinear programming according to one embodiment.

FIG. 1 illustrates one application for performing fluid contamination prediction techniques according to the present disclosure to predict contamination of a formation fluid in a borehole. In this application of FIG. 1, a downhole tool 110 analyzes fluid measurements from a formation. A conveyance apparatus 114 at the surface deploys the downhole tool 110 in a borehole 116 using a drill string, a tubular, a cable, a wireline, or other component 112.

The tool 110 can be any tool used for wireline formation testing, production logging, Logging While Drilling/Measurement While Drilling (LWD/MWD), or other operations. For example, the tool 110 as shown in FIG. 1 can be part of an early evaluation system disposed on a drill collar of a bottomhole assembly having a drill bit 115 and other necessary components. In this way, the tool 110 can analyze the formation fluids shortly after the borehole 116 has been drilled. As such, the tool 110 can be a Fluid-Sampling-While-Drilling (FSWD) tool. Alternatively, the tool 110 can be a wireline pump-out formation testing (WPFT) tool or any other type of testing tool.

In use, the tool 110 obtains formation fluids and measurements at various depths in the borehole 116 to determine properties of the formation fluids in various zones. To do this, the tool 110 can have a probe 150, a measurement device 120, and other components for in-situ sampling and analysis of formation fluids in the borehole 116. Rather than a probe 150, the tool 110 can have an inlet with straddle packers or some other known sampling component.

In general, any suitable type of formation testing inlet known in the art can be used, with some being more beneficial than others. Also, the disclosed analysis can be used with any type of drilling mud, such as oil-based or water-based muds.

During the sampling process, measurements are recorded in a memory unit 174, communicated or telemetered uphole for processing by surface equipment 130, or processed locally by a downhole controller 170. Each of these scenarios is applicable to the disclosed fluid composition analysis.

Although only schematically represented, it will be appreciated that the controller 170 can employ any suitable processor 172, program instructions, memory 174, and the like for achieving the purposes disclosed herein. The surface equipment 130 can be similarly configured. As such, the surface equipment 130 can include a general-purpose computer 132 and software 134 for achieving the purposes disclosed herein.

The tool 110 has a flow line 122 that extends from the probe 150 (or equivalent inlet) and the measurement section 120 through other sections of the tool 110. The inlet obtains fluid from the formation via the probe 150, isolation packers, or the like. As noted above, any suitable form of probe 150 or isolation mechanism can be used for the tool's inlet. For example, the probe 150 can have an isolation element 152 and a snorkel 154 that extend from the tool 110 and engage the borehole wall. A pump 127 lowers pressure at the snorkel 154 below the pressure of the formation fluids so the formation fluids can be drawn through the probe 150.

In a particular measurement procedure of the probe 150, the tool 110 positions at a desired location in the borehole 116, and an equalization valve (not shown) of the tool 110 opens to equalize pressure in the tool's flow line 122 with the hydrostatic pressure of the fluid in the borehole 116. A pressure sensor 164 measures the hydrostatic pressure of the fluid in the borehole. Commencing operations, the probe 150 positions against the sidewall of the borehole 116 to establish fluid communication with the formation, and the equalization valve closes to isolate the tool 110 from the borehole fluids. The probe 150 then seals with the formation to establish fluid communication.

At this point, the tool 110 draws formation fluid into the tool 110 using a fluid pumping module and the like. Sensors in the tool 110 measure the density and other physical properties of the fluid, and optical sensors in the tool 110 measure the absorption spectrum of the sample fluid at various wavelength channels. At various points, components such as valves, channels, chambers, and the pump 127 on the tool 110 operate to draw fluid from the formation that can be analyzed in the tool 110 and/or stored in one or more sample chambers 126. Eventually, the probe 150 can be disengaged, and the tool 110 can be positioned at a different depth to repeat the cycle.

Because the intention is to determine properties and constituents of the formation fluid, obtaining uncontaminated sampled fluid with the probe 150 is important. The sampled fluid can be contaminated by drilling mud because the probe 150 has made a poor seal with borehole wall, because mud filtrate has invaded the formation, and/or dynamic filtration through the mudcake establishes an equilibrium inflow during pump-out operations. Therefore, the fluid can contain hydrocarbon components (solids, liquids, and/or supercritical gas) as well as drilling mud filtrate (e.g., water-based mud or oil-based mud) or other contaminants. The drawn fluid flows through the tool's flow line 122, and various instruments and sensors (120 and 124) in the tool 110 analyze the fluid.

For example, the probe 150 and measurement section 120 can have sensors that measure various physical parameters (i.e., pressure, flow rate, temperature, density, viscosity, resistivity, capacitance, etc.) of the obtained fluid, and a measurement device, such as a spectrometer or the like, in a fluid analysis section 124 can determine physical and chemical properties of oil, water, and gas constituents of the fluid downhole using optical sensors. Eventually, fluid directed via the flow line 122 can either be purged to the annulus or can be directed to the sample carrier section 126 where the samples can be retained for additional analysis at the surface.

Additional components 128 of the tool 110 can hydraulically operate valves, move formation fluids and other elements within the tool 110, can provide control and power to various electronics, and can communicate data via wireline, fluid telemetry, or other method to the surface. Uphole, surface equipment 130 can have a surface telemetry unit (not shown) to communicate with the downhole tool's telemetry components. The surface equipment 130 can also have a surface processor (not shown) that performs processing of the data measured by the tool 110 in accordance with the present disclosure.

Because traditional techniques have been unable to predict when the level of filtrate contaminant will recede to a usable level, operators have needed to use inefficient techniques to attempt to ensure that a captured sample is sufficiently clear of contaminants. The techniques described below can guide the physical sampling process in view of both business goals and constraints, allowing an operator to decide when to sample the fluid with a reasonable expectation of acceptable purity, as well as allowing a forecast of how long fluid will need to be flushed through the tool before the purity reaches an acceptable level for capturing a sample. Such a forecast may then be used to help determine tradeoffs between purity levels and expected operational cost.

Overview

In the most generic sense, this computational method allows the resolution of mixture component systems from related observations (measurements) wherein not only the mixture coefficients are unknown, but so are the components themselves, which can at best be constrained from a priori knowledge. We employ the proposed method for the real-time prediction of the fluid contamination fraction as the fluid sample is being cleaned up.

Formulation

At any fixed time tick i, we are given an observed spectrum, $S_i$, of the fluid mixture. The fluid mixture can be categorized into a 2-component system i.e., mud filtrate and formation fluid, where each is an aggregate mixture of underlying basis constituents. We are to infer the fraction of each of the two aggregate components. Using Behr's law, we can write $S_i = \alpha_i FI + (1-\alpha_i)FO$, where $\alpha_i$ is the filtrate fraction at time tick i, FI is the filtrate spectrum, and FO is the formation fluid spectrum. A necessary condition for the inferability of $\alpha_1$ is that FI and FO are spectrally distinguishable i.e., FI≠FO. To see this, observe that if FI=FO, then it follows that $S_i$=FI=FO $\forall$i and therefore $\alpha_1$ is lost from the above equation. However, such a singular case can be clearly identified by observing that the measured spectrum $S_i$ becomes constant for all time ticks i. Under such singularity, the problem is unsolvable. Spectral distinguishability is implicit to the assumption that the sequence $(S_i)_i$ is not constant as that would immediately force FI≠FO. Having a time-varying observation sequence $(S_i)_i$ intrinsically imposes constraints on the contamination fraction sequence $(\alpha_i)_i$.

In the remainder of this disclosure, it will be assumed that FI and FO are inferrable from the sequence $(S_i)_i$ i.e., the sequence is not constant with time.

Formally, the problem computationally reduces to finding the pair of spectra FI and FO, and the contamination fraction sequence in discrete time steps i.e., $(\alpha_i)_i$. The variables satisfy the following system of equations:

$$\begin{cases} S_i = \alpha_i FI + (1-\alpha_i)FO \, \forall i \\ 0 \leq \alpha_i \leq 1 \, \forall i \end{cases}$$

Where, FI is a dead crude spectrum (i.e., no gasses) and FO is any live or dead crude spectrum. As such, each of FI and FO lives in a well-defined respective linear (polyhedral) space $P^{FI}$ and $P^{FO}$ (See U.S. patent application Ser. No. 14/931,729, entitled "System and Method for Fluid Composition Characterization," filed Nov. 3, 2015, on fluid composition prediction from spectral measurements with known basis components, which is incorporated by reference in its entirety for all purposes).

It can further be assumed that the sequence $(\alpha_i)_i$ satisfies temporal constraints in the form of $$(1-\tau)\alpha_{i-1} \leq \alpha_i \leq (1+\tau)\alpha_{i-1} \, \forall i > 1$$

for some chosen threshold τ, i.e., the relative change in the filtrate fraction with respect to the total non-invaded fraction as compared to the previous time tick is contained within a margin of τ. Alternatively, external information on how to bound $\alpha_i \forall i$ can be used if available (e.g., a near-wellbore simulator). The filtrate fraction for the first time tick is assumed to be within some known bounds i.e., $\alpha_1^l \leq \alpha_1 \leq \alpha_1^u$. In the absence of a priori information, the most conservative range for the initial bounds is presumed i.e., $\alpha_1^l = 0$ and $\alpha_1^u = 1$.

An additional temporal constraint on the evolution of the a sequence can be constructed based on the expectation that the general trend characterizing the evolution of the sequence is decreasing with increasing time steps. A negative general trend can be numerically stated in terms of some chosen filtering operation. For instance, if the filter is chosen to be the simple moving average of α over a window of size w, then imposing a decreasing moving average translates to this inequality:

$$\frac{\sum_{k=i+1}^{i+w} \alpha_k}{w} - \frac{\sum_{k=i}^{i+w-1} \alpha_k}{w} \leq \Delta^-$$

for all possible starting time ticks i, chosen window size w, and negative threshold $\Delta^-$. The particular filter based inequality above is equivalent to $\alpha_{i+w} - \alpha_i \leq \Delta^-$. Other filtering schemes are possible (e.g., cumulative moving average).

To this end, a second singularity case is identified. Pumping fluid mixtures in the presence of water does not yield uniform measurements. This is because oil and water do not mix uniformly and as fluid is being pumped, the tool might see a particular section (i.e., plug) of the fluid mixture at one time tick and the complete fluid mixture at another. It is the manifestation of these plugs that breaks the fundamental spectral equation in terms of the two fluid components assumed constant throughout the pumping operation. We will assume that a time tick where a plug is manifested can be accurately identified every time. This can be determined according to the operations outlined in U.S. patent application Ser. No. 14/931,729, for instance when it can be predicted that the water fraction is above a certain high threshold level. Alternatively, it can be also identified when the above system of constraints becomes infeasible (i.e., no such desired contamination fraction sequence exists). As such, the set of all time ticks where no plugs are identified is denoted by I*.

Bilinear Optimization Problem

Because the 2-component spectral equation is only valid up to a certain measurement error in $S_i$, the above formulation is amenable to an optimization approach. In particular, we may seek to minimize the total errors over all time ticks, where the error at a time tick i is assessed via the first norm of the difference vector, i.e., $\|S_i - (\alpha_i FI + (1-\alpha_i)FO)\|_1$, subject to all of the available constraints. Formally, $$\operatorname*{argmin}_{\alpha, FI, FO} \sum_{i \in I^*} \|S_i - (\alpha_i FI + (1-\alpha_i)FO)\|_1$$

$$\text{subject to} \begin{cases} \alpha_1^l \leq \alpha_1 \leq \alpha_1^u \\ (1-\tau)\alpha_{i-1} \leq \alpha_i \leq (1+\tau)\alpha_{i-1} \, \forall i > 1 \\ \alpha_{i+w} - \alpha_i \leq \Delta^- \, \forall i \\ 0 \leq \alpha_i \leq 1 \, \forall i \\ FI \in P^{FI} \\ FO \in P^{FO} \end{cases}$$

Define the slack variables $\varepsilon_i = \|S_i - (\alpha_i FI + (1-\alpha_i)FO)\|_1 = \sum_j \varepsilon_{i,j} \forall i \in I^*$ where $\varepsilon_{i,j} = |S_{i,j} - (\alpha_i FI_j + (1-\alpha_i)FO_j)| \forall i \in I^*, \forall j$ and where i is the time tick index and j is the spectral frequency index. The above optimization problem can be equivalently expressed via defining $\varepsilon_{i,j}$ in terms of the following double inequality: $-\varepsilon_{i,j} \leq S_{i,j} - (\alpha_i FI_j + (1-\alpha_i)FO_j) \leq \varepsilon_{i,j} \forall i \in I^*, \forall j$. The above constrained optimization problem can therefore be equivalently expressed as follows, $$\operatorname*{argmin}_{\alpha, FI, FO} \sum_i \sum_j \varepsilon_{i,j}$$

$$\text{subject to} \begin{cases} \alpha_1^l \le \alpha_1 \le \alpha_1^u \\ (1-\tau)\alpha_{i-1} \le \alpha_i \le (1+\tau)\alpha_{i-1} \,\forall\, i > 1 \\ \alpha_{i+w} - \alpha_i \le 0 \,\forall\, i \\ -\varepsilon_{i,j} \le S_{i,j} - (\alpha_i FI_j + (1-\alpha_i) FO_j) \le \varepsilon_{i,j} \,\forall\, i \in I^*, \forall\, j \\ 0 \le \alpha_i \le 1 \,\forall\, i \\ FI \in P^{FI} \\ FO \in P^{FO} \end{cases}$$

Hence, computing the contamination fraction in real-time reduces to solving a linear objective function subject to linear and bilinear constraints. This class of optimization problems can be solved via constructing concave and convex envelopes around all unknown bilinear terms and then employing a branch-and-bound strategy as delineated in U.S. patent application Ser. No. 14/713,591 entitled "System and Method for Joint Inversion of Bed Boundaries and Petrophysical Properties from Borehole Logs," filed May 15, 2015, on inverting bed properties from bed boundary measurements, which is incorporated by reference in its entirety for all purposes.

Predicting Contamination Fraction Bounds

Let O* stand for the optimal objective value of the bilinear programming problem above and refer to the optimal solution space as the set of all solutions admitting O* per objective value i.e., the following bipolyhedral set BP, i.e., $$BP = \left\{ (\alpha, FI, FO) \middle| \begin{array}{l} \sum_i \sum_j \varepsilon_{i,j} = O^* \\ \alpha_1^l \le \alpha_1 \le \alpha_1^u \\ (1-\tau)\alpha_{i-1} \le \alpha_i \le (1+\tau)\alpha_{i-1} \,\forall\, i > 1 \\ \alpha_{i+w} - \alpha_i \le 0 \,\forall\, i \\ -\varepsilon_{i,j} \le S_{i,j} - (\alpha_i FI_j + (1-\alpha_i) FO_j) \le \varepsilon_{i,j} \,\forall\, i \in I^*, \forall\, j \\ 0 \le \alpha_i \le 1 \,\forall\, i \\ FI \in P^{FI} \\ FO \in P^{FO} \end{array} \right\}$$

Computing the minimum and maximum optimal values for $\alpha_1$ (respectively, $\alpha_i^l$ and $\alpha_i^u$ at any fixed time tick i can be achieved by solving the following two optimization problems, $$\alpha_i^l = \min_{(\alpha, FI, FO) \in BP} \alpha_i$$

and $$\alpha_i^u = \max_{(\alpha, FI, FO) \in BP} \alpha_i$$

Note the above two optimization problems are of the same class as of that which calculates O*.

Practical Implementation

The size of the bilinear problems outlined thus far may grow arbitrarily in terms of the number of time ticks. To avoid prohibitive computational overheads, we impose a maximum number of time ticks that may be solved at once. This maximum can be chosen experimentally so that computation remains affordable for real-time applications (given a chosen time budget). Starting at time tick 1, after the number of maximum time ticks is reached, the first time tick is discarded to allow for the newest time tick. Discarding the first time tick translates to fixing the predicted bounds on $\alpha_1$ i.e., without further back-in-time updates to it after new time ticks data are received. The process continues in a sliding window fashion. This sliding window for overhead performance improvement is not to be confused with the sliding window in case of the moving average filter.

Figure 2:
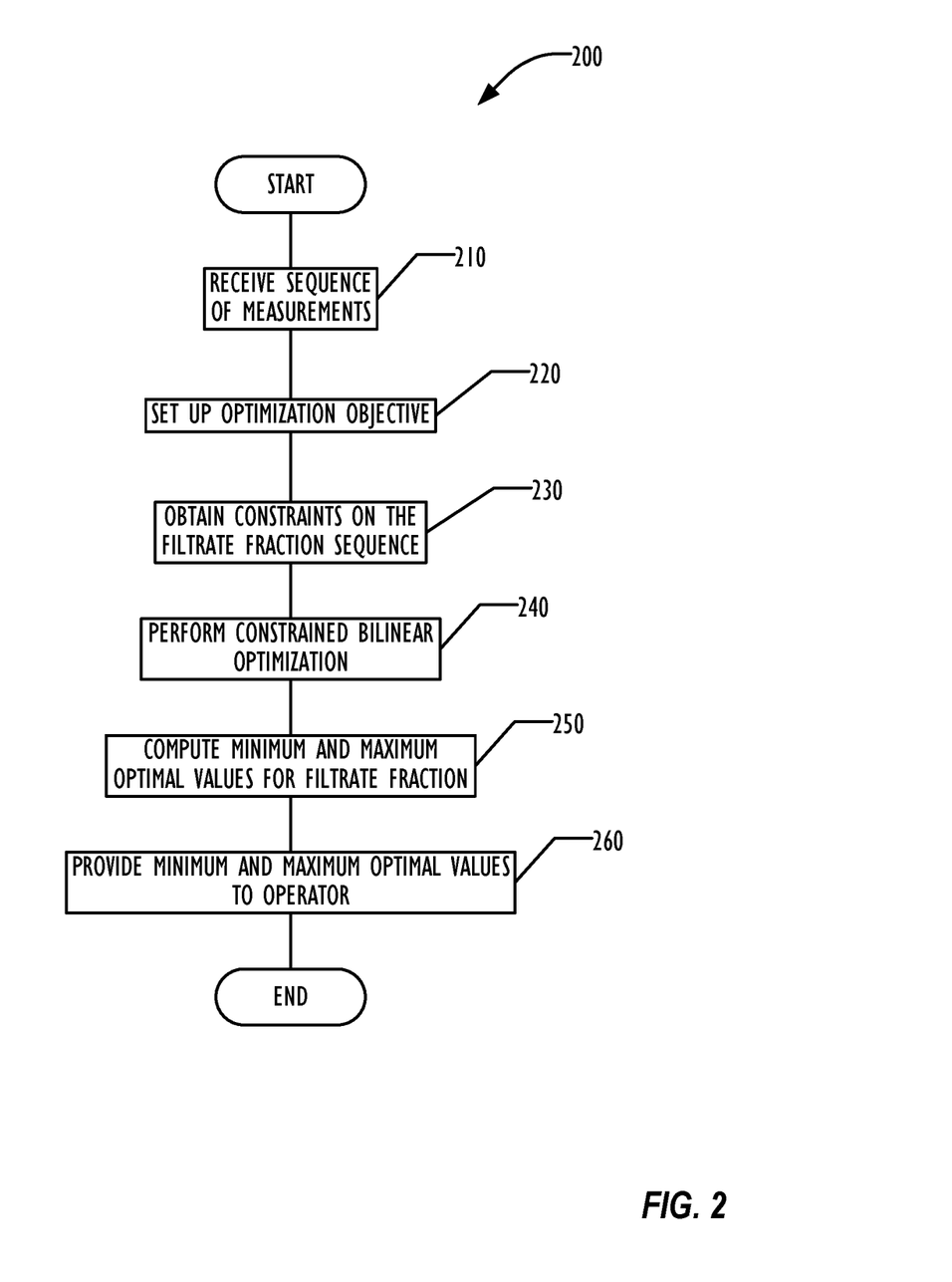
FIG. 2 is a flowchart illustrating implementing a bilinear technique for predicting contamination in an unknown fluid according to one embodiment.

FIG. 2 is a flowchart of a technique 200 for implementing the bilinear techniques for which the equations above represent an approach to predicting contamination in an unknown fluid. In block 210, a sequence of measurements is received, typically using a sliding window technique as described above. In block 220, the optimization objective and its associated constraints are set up given the measurements obtained in block 210. In block 230, constraints on the filtrate fraction sequence are obtained as outlined above.

In block 240, the constrained bilinear optimization problem is solved and in block 250 minimum and maximum optimal values for the filtrate fraction at every time tick i is computed. These minimum and maximum values are provided to the operator in block 260. Any desired technique may be used to provide the minimum and maximum optimal values to the operator, including graphical and numerical displays. In some embodiments, these values may be used as input for automatically making decisions regarding the sampling procedure, including deciding when to start sampling the fluid based on the computed minimum and maximum filtrate fractions.

Figure 3:
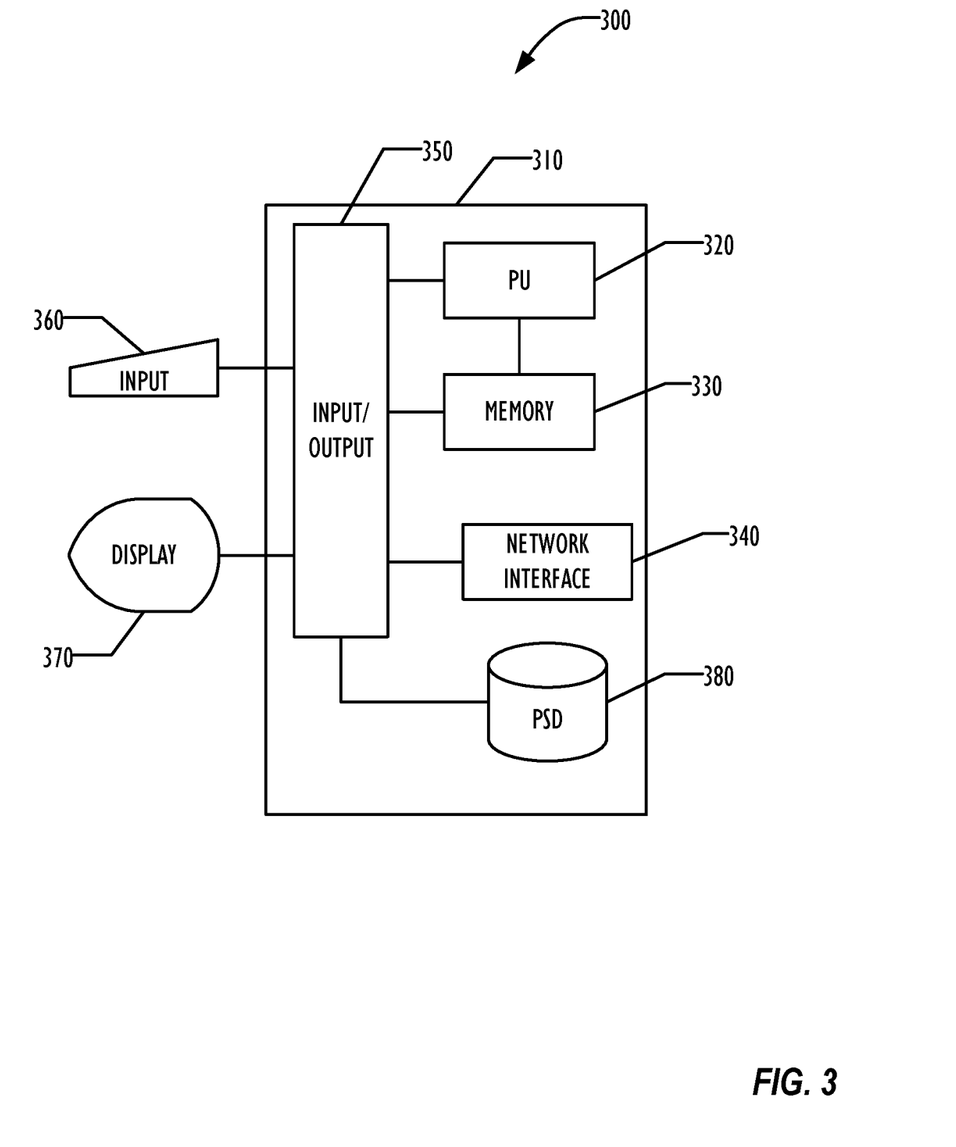
FIG. 3 is a block diagram illustrating a computer system for performing fluid composition characterization techniques according to one embodiment.

Referring now to FIG. 3, an example processing device 300 for use in performing the fluid composition characterization techniques discussed herein according to one embodiment is illustrated in block diagram form. Processing device 300 may serve as processor in a tool, a server, a computer, or the like. Example processing device 300 includes a system unit 310 which may be optionally connected to an input device 360 and output device 370. A program storage device (PSD) 380 (sometimes referred to as a hard disk, flash memory, or non-transitory computer readable medium) is included with the system unit 310. Also included with system unit 310 is a communication interface 340 for communication via a network with other remote and/or embedded devices (not shown). Communication interface 340 may be included within system unit 310 or be external to system unit 310. In either case, system unit 310 will be communicatively coupled to communication interface 340. Program storage device 380 represents any form of non-volatile storage including, but not limited to, all forms of optical and magnetic memory, including solid-state, storage elements, including removable media, and may be included within system unit 310 or be external to system unit 310. Program storage device 380 may be used for storage of software to control system unit 310, data for use by the processing device 300, or both.

System unit 310 may be programmed to perform methods in accordance with this disclosure. System unit 310 also includes one or more processing units 320, input-output (I/O) bus 350 and memory 330. Access to memory 330 can be accomplished using the input-output (I/O) bus 350. Input-output (I/O) bus 350 may be any type of interconnect including point-to-point links and busses. Processing unit 320 may include any programmable controller device including, for example, a suitable processor. Memory 330 may include one or more memory modules and comprise random access memory (RAM), read only memory (ROM), programmable read only memory (PROM), programmable read-write memory, and solid-state memory.

Value of the Techniques

Prediction of the purity of the sampled fluid in real-time has a direct implication to operational decision making. In particular, such a prediction can be used to systematically guide the physical sampling process in view of both business goals and constraints. For instance, if the operator can determine that the fluid has attained sufficient purity, then sampling can be initiated. The predicted discrete bounds time-series can also be used to forecast a model for the expected duration needed to achieve a desired fluid purity before sampling. The forecast model can be obtained by curve-fitting each of the two predicted contamination fraction bounding curves. Such a forecast can, in turn, be used to decide whether to review the objective (required purity) in view of the expected operational cost. Predicted contamination fraction bounds can provide best and worst case scenarios which can help in managing risk and reward.

It is also conceivable that an operator may want to terminate the pumping process and initiate the sampling when these techniques can predict that a particular constituent of interest or the sum thereof (e.g., total hydrocarbon from formation) is above a minimum fraction value even before the fluid has reached a sufficient purity. Predicting bounds on the fraction of any base constituent or sum of several can be done in analogous fashion as outlined above for the bounds of the contamination fraction.

Finally, it should be noted that this method although described with spectroscopic measurements, it is inherently applicable with measurements of any changing fluid properties such as density and refractive index.

It is to be understood that the above description is intended to be illustrative, and not restrictive. For example, the above-described embodiments may be used in combination with each other. Many other embodiments will be apparent to those of skill in the art upon reviewing the above description. The scope of the invention therefore should be determined with reference to the appended claims, along with the full scope of equivalents to which such claims are entitled.

What is claimed is:

1. A method of sampling a wellbore fluid with a downhole tool and at least one processor, comprising:
receiving a sequence of measurements of the wellbore fluid obtained with the downhole tool, wherein the wellbore fluid comprises unknown fractions of a formation fluid and a filtrate fluid, each of unknown composition;
obtaining, with the at least one processor, constraints on the filtrate fraction in the sequence of measurements;
performing, with the at least one processor, a constrained bilinear optimization that minimizes total measurement error over the sequence of measurements subject to a collection of the obtained constraints;
predicting a purity of the formation fraction in the wellbore fluid by computing, with the at least one processor, a minimum and maximum optimal value for the filtrate fraction at each of the sequence of measurements; and
determining, with the at least one processor, a start to sampling of the wellbore fluid based on the purity predicted from the minimum and maximum optimal values for the filtrate fraction.

2. The method of claim 1, wherein one of the obtained constraints on the sequence of measurements is based on initial conditions of the filtrate fraction.

3. The method of claim 1, wherein one of the obtained constraints on the sequence of the measurements is based on temporal constraints.

4. The method of claim 1, wherein predicting the purity of the formation fraction in the wellbore fluid further comprises:
forecasting a time duration before the filtrate fraction is below a predetermined threshold based on the computed sequence of the minimum and maximum optimal values for the filtrate fraction.

5. The method of claim 3, wherein the temporal constraints constrain change in the filtrate fraction relative to the formation fluid fraction between members of the sequence of measurements within a predetermined margin value.

6. The method of claim 3, wherein the temporal constraints comprise external information on how to bound the filtrate fraction at each of the sequence of measurements.

7. The method of claim 1, wherein receiving the sequence of measurements of the wellbore fluid obtained with the downhole tool comprises performing a filtering operation on the wellbore fluid obtained with the downhole tool; and wherein one of the obtained constraints on the sequence of the filtrate fractions is based on the filtering operation.

8. The method of claim 7, wherein performing the filtering operation on the wellbore fluid obtained with the downhole tool comprises computing a moving average of the filtrate fraction over a window of a predetermined size.

9. The method of claim 1, wherein the sequence of measurements comprises a sequence of spectroscopic measurements.

10. The method of claim 9, wherein each of the sequence of measurements comprises a spectroscopic response that is due to a spectrum associated with the filtrate and its fraction.

11. The method of claim 10, wherein the spectrum associated with the filtrate exists in a linear polyhedral space.

12. The method of claim 9, wherein each of the sequence of measurements comprises a spectroscopic response that is due to a spectrum associated with the formation fluid and its fraction.

13. The method of claim 12, wherein the spectrum associated with the formation fluid is a live or dead crude spectrum that exists in a linear polyhedral space.

14. The method of claim 1, wherein the sequence of measurements comprises a sequence of density measurements.

15. The method of claim 1, wherein the sequence of measurements comprises a sequence of refractive index measurements.

16. The method of claim 1, wherein the sequence of measurements comprises a sliding window of measurements, and wherein the constrained bilinear optimization and the computation of the minimum and maximum optimal values for the filtrate fraction are repeatedly performed on the sliding window of measurements.

17. The method of claim 1, wherein determining, with the at least one processor, the start to sampling of the wellbore fluid based on the minimum and maximum optimal values for the filtrate fraction further comprises:
determining that the filtrate fraction is below a predetermined threshold; and initiating sampling of the wellbore fluid responsive to the determination that the filtrate fraction is below the predetermined threshold.

18. The method of claim 1, wherein determining, with the at least one processor, a start to sampling of the wellbore fluid based on the minimum and maximum optimal values for the filtrate fraction further comprises:
   determining that a total fraction of one or more constituents of interest is within a predetermined margin; and
   initiating sampling of the wellbore fluid responsive to the determination that the total fraction of the one or more constituents of interest is within the predetermined margin.

19. The method of claim 1, wherein the filtrate fraction comprises unknown contaminants.

20. The method of claim 1, further comprising identifying and using measurements over time ticks that exclude those where the measurements correspond to only sections of the wellbore fluid based on predicted total fractions of appropriate constituents or based on filtrate fraction constraints violation.

21. The method of claim 1, wherein each of the collection of obtained constraints is a linear constraint or a bilinear constraint.

22. The method of claim 1, wherein computing the minimum and maximum optimal value for the filtrate fraction at each of the sequence of measurements comprises:
   solving an optimization of a minimum value of the filtrate fraction over a bipolyhedral set; and
   solving an optimization of a maximum value of the filtrate fraction over the bipolyhedral set.

23. A non-transitory program storage device with instructions stored thereon, comprising instructions that when executed cause one or more processors to:
   receive a sequence of measurements of a wellbore fluid obtained with a downhole tool, wherein the wellbore fluid comprises unknown fractions of a formation fluid and a filtrate fluid, each of unknown composition;
   obtain constraints on the filtrate fraction in the sequence of measurements;
   perform a constrained bilinear optimization that minimizes total measurement error over the sequence of measurements subject to a collection of the obtained constraints;
   compute a minimum and maximum optimal value for the filtrate fraction at each of the sequence of measurements predicting a purity of the formation fraction in the wellbore fluid; and
   determine a start to sampling of the wellbore fluid based on the purity predicted from the minimum and maximum optimal values for the filtrate fraction.

24. The program storage device of claim 23, wherein to receive the sequence of measurements of the wellbore fluid obtained with the downhole tool, the instructions that when executed cause the one or more processors of the downhole tool having the downhole tool to perform a filtering operation on the wellbore fluid obtained with the downhole tool; and wherein one of the obtained constraints on the sequence of measurements is based on the filtering operation.

25. The program storage device of claim 24, wherein to perform the filtering operation, the instructions that when executed cause the one or more processors to compute a moving average of the filtrate fraction over a window of a predetermined size.

26. The program storage device of claim 23, wherein the sequence of measurements comprises a sequence of spectroscopic measurements.

27. The program storage device of claim 26, wherein each of the sequence of measurements comprises a spectroscopic response that is due to a spectrum associated with the filtrate and its fraction.

28. The program storage device of claim 26, wherein each of the sequence of measurements comprises a spectroscopic response that is due to a spectrum associated with the formation fluid and its fraction.

29. The program storage device of claim 23, wherein the sequence of measurements comprises a sequence of density measurements.

30. The program storage device of claim 23, wherein the sequence of measurements comprises a sliding window of measurements, and wherein the constrained bilinear optimization and the computation of the minimum and maximum optimal values for the filtrate fraction are repeatedly performed on the sliding window of measurements.

31. The program storage device of claim 23, wherein the instructions further comprise instructions that when executed cause at least some of the one or more processors to:
   determine that the filtrate fraction is below a predetermined threshold; and
   initiate sampling of the wellbore fluid responsive to the determination that the filtrate fraction is below the predetermined threshold.

32. The program storage device of claim 23, wherein the instructions further comprise instructions that when executed cause at least some of the one or more processors to:
   determine that a total fraction of one or more constituents of interest is within a predetermined margin; and
   initiate sampling of the wellbore fluid responsive to the determination that the total fraction of the one or more constituents of interest is within the predetermined margin.

33. The program storage device of claim 23, wherein the filtrate fraction comprises unknown contaminants.

34. The program storage device of claim 23, wherein the instructions further comprise instructions that when executed cause the one or more processors to: identify and use measurements over time ticks that exclude those where the measurements correspond to only sections of the wellbore fluid based on predicted total fractions of appropriate constituents or based on filtrate fraction constraints violation.

35. The program storage device of claim 23, wherein each of the collection of obtained constraints is a linear constraint or a bilinear constraint.

36. The program storage device of claim 23, wherein the instructions that when executed cause the one or more processors to compute a minimum and maximum optimal value for the filtrate fraction at each of the sequence of measurements comprise instructions that when executed cause the one or more processors to:
   solve an optimization of a minimum value of the filtrate fraction over a bipolyhedral set; and
   solve an optimization of a maximum value of the filtrate fraction over the bipolyhedral set.

37. A system, comprising:
   a downhole tool configured to obtain a sequence of measurements of a wellbore fluid;
   a processor; and
   a memory having instructions stored therein, comprising instructions that when executed cause the processor to:
      receive the sequence of measurements of the wellbore fluid obtained with the downhole tool, wherein the wellbore fluid comprises unknown fractions of a formation fluid and a filtrate fluid, each of unknown composition;

obtain constraints on the filtrate fraction in the sequence of measurements;

perform a constrained bilinear optimization that minimizes total measurement error over the sequence of measurements subject to a collection of the obtained constraints;

compute a minimum and maximum optimal value for the filtrate fraction at each of the sequence of measurements predicting a purity of the formation fraction in the wellbore fluid; and determine a start to sampling of the wellbore fluid based on the purity predicted from the minimum and maximum optimal values for the filtrate fraction.

38. The system of claim 37, wherein to receive the sequence of measurements of the wellbore fluid obtained with the downhole tool, the instructions that when executed cause the processor to perform a filtering operation on the wellbore fluid obtained with the downhole tool; and wherein one of the obtained constraints on the sequence of the measurements is based on the filtering operation.

39. The system of claim 38, wherein to perform the filtering operation, the instructions that when executed cause the one or more processors to compute a moving average of the filtrate fraction over a window of a predetermined size.

40. The system of claim 37, wherein the sequence of measurements comprises a sequence of spectroscopic measurements.

41. The system of claim 40, wherein each of the sequence of measurements comprises a spectroscopic response that is due to a spectrum associated with the filtrate and its fraction.

42. The system of claim 40, wherein each of the sequence of measurements comprises a spectroscopic response that is due to a spectrum associated with the formation fluid and its fraction.

43. The system of claim 37, wherein the sequence of measurements comprises a sequence of density measurements.

44. The system of claim 37, wherein the sequence of measurements comprises a sliding window of measurements, and wherein the constrained bilinear optimization and the computation of the minimum and maximum optimal values for the filtrate fraction are repeatedly performed on the sliding window of measurements.

45. The system of claim 37, wherein the instructions further comprise instructions that when executed cause the processor to:

determine that the filtrate fraction is below a predetermined threshold; and initiate sampling of the wellbore fluid responsive to the determination that the filtrate fraction is below the predetermined threshold.

46. The system of claim 37, wherein the instructions further comprise instructions that when executed cause the processor to:

determine that a total fraction of one or more constituents of interest is within a predetermined margin; and initiate sampling of the wellbore fluid responsive to the determination that the total fraction of one or more constituents of interest is within the predetermined margin.

47. The system of claim 37, wherein the filtrate fraction comprises unknown contaminants.

48. The system of claim 37, wherein the instructions further comprise instructions that when executed cause the processor to:

identify and use measurements over time ticks that exclude those where the measurements correspond to only sections of the wellbore fluid based on predicted total fractions of appropriate constituents or based on filtrate fraction constraints violation.

49. The system of claim 37, wherein each of the collection of obtained constraints is a linear constraint or a bilinear constraint.

50. The system of claim 37, wherein the instructions that when executed cause the processor to compute a minimum and maximum optimal value for the filtrate fraction at each of the sequence of measurements comprise instructions that when executed cause the processor to:

solve an optimization of a minimum value of the filtrate fraction over a bipolyhedral set; and solve an optimization of a maximum value of the filtrate fraction over the bipolyhedral set.

* * * * *